United States Patent
Zylowski

(10) Patent No.: US 7,489,912 B2
(45) Date of Patent: Feb. 10, 2009

(54) SIGNAL RECEIVER AND METHOD FOR OPTIMIZING GAIN OF A TUNER

(75) Inventor: Sebastian Zylowski, Zielona Gora (PL)

(73) Assignees: Advanced Digital Broadcast Polska SP. Z O.O., Zielona Góra (PL); Advanced Digital Broadcast, Ltd., Taipei (TW)

( * ) Notice: Subject to any disclaimer, the term of this patent is extended or adjusted under 35 U.S.C. 154(b) by 702 days.

(21) Appl. No.: 11/160,527

(22) Filed: Jun. 28, 2005

(65) Prior Publication Data

US 2006/0094383 A1    May 4, 2006

(30) Foreign Application Priority Data

Oct. 28, 2004    (EP)    ................... 04460045

(51) Int. Cl.
*H04B 1/06*    (2006.01)
*H04B 7/00*    (2006.01)

(52) U.S. Cl. ................. 455/130; 455/232.1; 455/234.1; 455/250.1

(58) Field of Classification Search .............. 455/67.11, 455/67.13, 67.16, 136, 138, 173.1, 184.1, 455/226.1–226.2, 232.1, 234.1–234.2, 241.1, 455/245.1–251.1; 348/678, 725, 726, 729, 348/731, 735

See application file for complete search history.

(56) References Cited

U.S. PATENT DOCUMENTS

| | | | |
|---|---|---|---|
| 5,940,143 A * | 8/1999 | Igarashi et al. ............... | 348/678 |
| 6,148,189 A * | 11/2000 | Aschwanden ............ | 455/234.1 |
| 6,178,211 B1 | 1/2001 | Whikehart et al. | |
| 6,965,656 B2 * | 11/2005 | Koizumi ..................... | 375/345 |
| 7,171,176 B1 * | 1/2007 | Birleson .................. | 455/173.1 |
| 7,260,143 B2 * | 8/2007 | Matsuura ..................... | 375/222 |
| 7,271,852 B2 * | 9/2007 | Paik et al. .................... | 348/725 |
| 7,317,493 B1 * | 1/2008 | Hutchinson et al. ......... | 348/678 |
| 2006/0164563 A1 * | 7/2006 | Watanabe et al. ........... | 348/731 |

FOREIGN PATENT DOCUMENTS

| EP | 0 903 937 A2 | 3/1999 |
|---|---|---|
| EP | 1 398 930 A1 | 3/2004 |

* cited by examiner

*Primary Examiner*—Simon D Nguyen
(74) *Attorney, Agent, or Firm*—Matthias Scholl P.C.; Matthias Scholl

(57) ABSTRACT

A signal receiver (300) has a tuner (301), which receives an RF_IN signal and outputs a desired IF_OUT intermediate frequency signal to a demodulator (311). The demodulator (311) controls the RF_AGC and IF_AGC tuner gains according to an AGC characteristic of the tuner, to provide a constant level of the IF_OUT signal. The demodulator (311) sends to the processor (321) a digital stream of a desired signal TS. The processor comprises an AGC characteristic controller (327) for calculating the AGC characteristic of the tuner on the basis of a level of the desired signal and a strongest level of close signals, which are detected within the passband of the input filter (101) of the tuner (301) for the desired signal.

10 Claims, 7 Drawing Sheets

SIGNAL RECEIVER AND METHOD FOR OPTIMIZING GAIN OF A TUNER

CROSS-REFERENCE TO RELATED APPLICATIONS

This application claims priority to the European Patent Application No. EP 04460045.0, filed Oct. 28, 2004, the contents of which are incorporated herein by reference.

BACKGROUND OF THE INVENTION

1. Field of the Invention

The object of the invention is a signal receiver and a method for optimizing gain of a tuner.

2. Brief Description of the Background of the Invention Including Prior Art

A common problem during the signal reception, especially the reception of terrestrial television signals, is related to strong undesired signals close to a weak desired signal. The strong signals may be generated by a transmitter, which is closer than the transmitter of the desired signal. There are several known methods for solving this problem, but they are applicable for specific receivers only.

There is known from the U.S. Pat. No. 6,178,211 "*Digital processing radio receiver with adaptive bandwidth control*" a method for processing an intermediate frequency signal, in which the filter characteristic is narrowed in order to eliminate the interferences from the adjacent signals. The method can be used only in receivers, which allow controlling the width of the filter characteristic.

There is known from the European patent application No. 0903937A2 "*Digital television signal receiving tuner system*" a dual frequency conversion tuner, in which the first intermediate frequency filter attenuates the signals close to the received signal. However, it attenuates only signals within the passband of the first IF filter, and it does not protect against the overload of the input stages of the tuner by signals outside the passband of the IF filter, but within the passband of the input filter.

There is known from the European patent application No. 1398930A1 entitled "*Radio-frequency-signal-receiver and method of manufacturing the same*" a method for optimizing the gain of a tuner, in which the input stage may be disrupted by strong signals close to a weak desired signal, where the AGC characteristic of the tuner is adjusted to compensate the effect of strong close signals. However, to determine the level of close signals, a distinct peak power detector is used as an additional component of the tuner, the detector band being limited by a filter. Such solution is applicable only to custom-designed tuners.

The present invention is designed for single or dual frequency conversion tuners, especially that in form of an integrated circuit chip, in which the width of the passband of the last intermediate frequency filter is narrower than the width of the passband of the high frequency input filter. An exemplary structure of a dual frequency conversion tuner is shown in FIG. 1. The tuner can be implemented as a single integrated circuit chip or can be comprised of several separate circuits. The tuner receives an input signal RF_IN, which is filtered by a band-pass high frequency input filter 101 (which may consist of a set of wideband filters). The filtered input signal is amplified by a Variable Gain Amplifier (VGA) 102, whose gain is controlled by RF_AGC signal, generated by a demodulator. The first mixer Mixer_1 103 converts the signal to a first intermediate frequency (IF). The mixed signal is filtered by a band-pass first IF filter SAW1 104, whose passband width is narrower than the passband width of the input filter. The signal is next converted by the second mixer Mixer_2 105 to a second intermediate frequency. Next the signal is input through a Fixed Gain Amplifier (FGA) 106 to a second IF filter SAW2 107. The signal from the SAW2 filter 107 is amplified by a second IF amplifier IF_Amplifier 109 with its gain controlled by IF_AGC signal, and next, the signal is output to the demodulator. The structure of a single frequency conversion tuner differs from that shown in FIG. 1 basically in that it does not comprise the elements shown in the dotted line, i.e. the first mixer 103 and the SAW1 filter 104, therefore it utilizes the intermediate frequency signal of a single frequency. The common characteristic of these two tuner types is that the width of the passband of the input filter 101 is larger than the width of the passband of the intermediate frequency filter SAW2 107.

The tuners of such structure may have a problem in reception of signals, close to which, within the passband of the input filter, are other stronger signals. The problem has been illustrated in FIG. 2. The RF_AGC and IF_AGC gains are set such that a signal of a constant level, required by a demodulator, is present on the IF_OUT output. The RF_AGC and IF_AGC correction is based only on the level of the signal within the passband of the last IF filter, and it does not include all signals that are within the passband of the input filter 101. Therefore, if the tuner gains were adjusted to the level of the weak signal S1, this could lead to tuner overload by a strong signal S2. The known solution to this problem is to set such AGC characteristic of the tuner that will decrease the gain of the VGA 102 amplifier, and concurrently increase the gain of the IF_Amp 109 amplifier. However, since the AGC characteristic in the known solution is constant, it requires a compromise. If the AGC characteristic would strongly limit the RF_AGC gain, it would be impossible to receive weak signals. If it would allow high RF_AGC gains, the tuner could be overloaded by strong signals close to the desired signal.

SUMMARY OF THE INVENTION

Purposes of the Invention

It is an object of the present invention to provide means for setting an optimal tuner gain, dependent on the level of the desired signal and signals close to it.

This and other objects and advantages of the present invention will become apparent from the detailed description, which follows.

Brief Description of the Invention

The idea of the invention is that in a method for optimizing gain of a tuner for reception of a desired signal, where the tuner is equipped with a band-pass high frequency input filter and a band-pass intermediate frequency filter, and where the width of the passband of the input filter is higher than the width of the passband of the intermediate frequency filter, the passband of the input filter and the signal level are identified for the desired signal, and next the strongest signal level in the passband of the input filter is detected on the basis of the tuner gain, and on the basis of the strongest signal level and the desired signal level the AGC characteristic of the tuner is calculated and the tuner is tuned to the desired signal using the calculated AGC characteristic.

The input filter can consist of a set of wideband filters, and in order to identify the passband of the input filter it is determined which wideband filter is activated for the desired signal and its parameters are read.

Preferably, the strongest signal level in the passband of the input filter is detected by tuning the tuner to successive signals within the passband of the input filter and for each tuned signal the RF and IF stages gain levels are read and on the basis of them the level of the input signal is calculated, and the strongest signal level read so far is stored.

The tuner can be tuned to successive signals in steps equal to the width of the passband of the intermediate frequency filter.

The tuner can be also tuned to successive signals in steps equal to the quotient of the difference between the width or the passband of the input filter and the width of the passband of the intermediate frequency filter, and the minimum number of steps required to analyze the whole passband of the input filter.

The AGC characteristic of the tuner can be calculated on the basis of the primary characteristic, for which, if the strongest signal level is higher than the desired signal level, the optimal RF_AGC characteristic is calculated such that the undesired signals do not cause the overload of the input stages of the tuner and the reception of a weak signal is possible, and next the IF_AGC characteristic is adjusted to the RF_AGC characteristic.

The essence of the invention is that a signal receiver with a tuner, has a band-pass high frequency input filter and a band-pass intermediate frequency filter, where the width of the passband of the input filter is higher than the width of the passband of the intermediate frequency filter. The receiver has also a demodulator controlling the gain levels of the tuner according to a defined AGC characteristic and a processor with a tuner controller. The tuner controller comprises an input filter identifier identifying the passband of the input filter for a desired signal, a desired signal level detector, a detector of the strongest signal level in a given band on the basis of the tuner gain and a controller of AGC characteristic on the basis of the strongest signal level and the desired signal level.

Preferably, the strongest signal detector block tunes the tuner to successive signals within the analyzed band, reads the gain levels of the RF and IF stages and on the basis of them calculates the level of the input signal, and stores the strongest signal level.

BRIEF DESCRIPTION OF THE DRAWINGS

In the accompanying drawings one of the possible embodiments of the present invention is shown, where.

DESCRIPTION OF INVENTION AND PREFERRED EMBODIMENT

Figure 1:
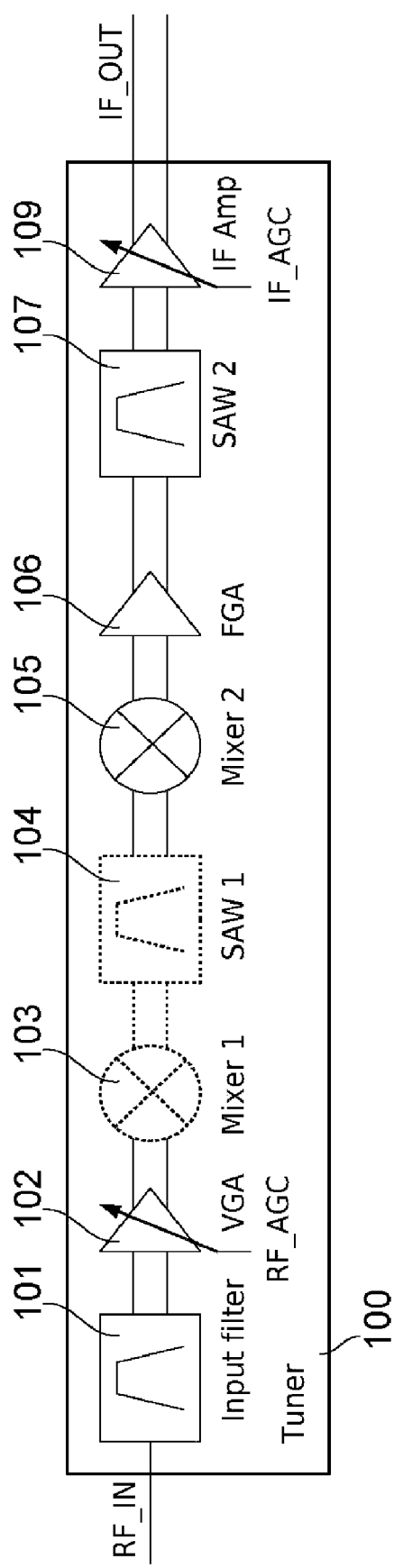
FIG. 1 shows a dual frequency conversion tuner.
Figure 2:
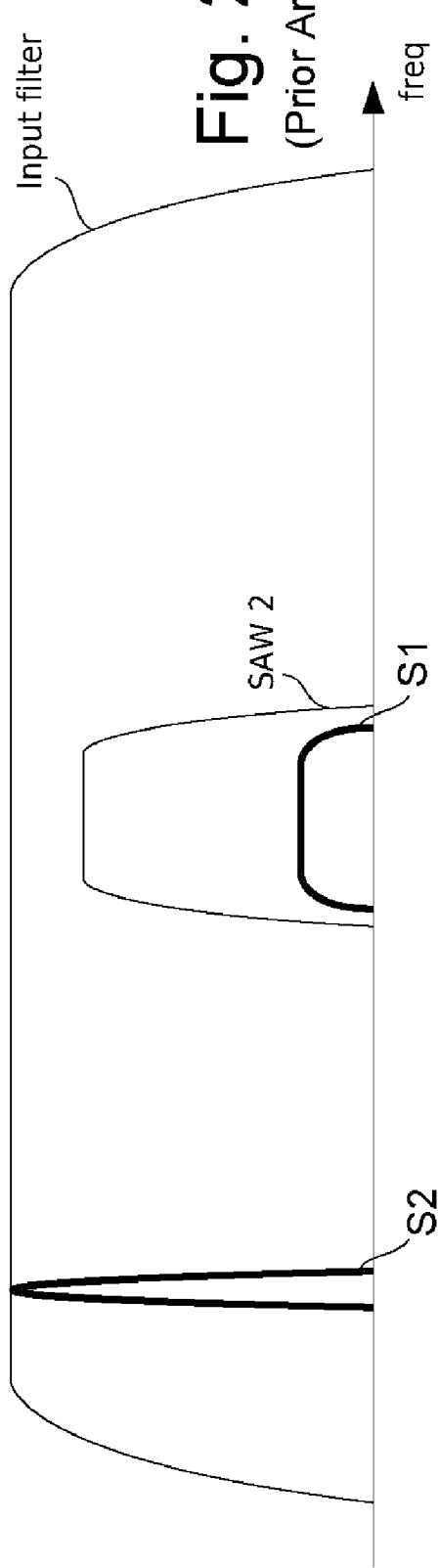
FIG. 2 shows a weak signal with an adjacent stronger signal within a passband of an input filter.
Figure 3:
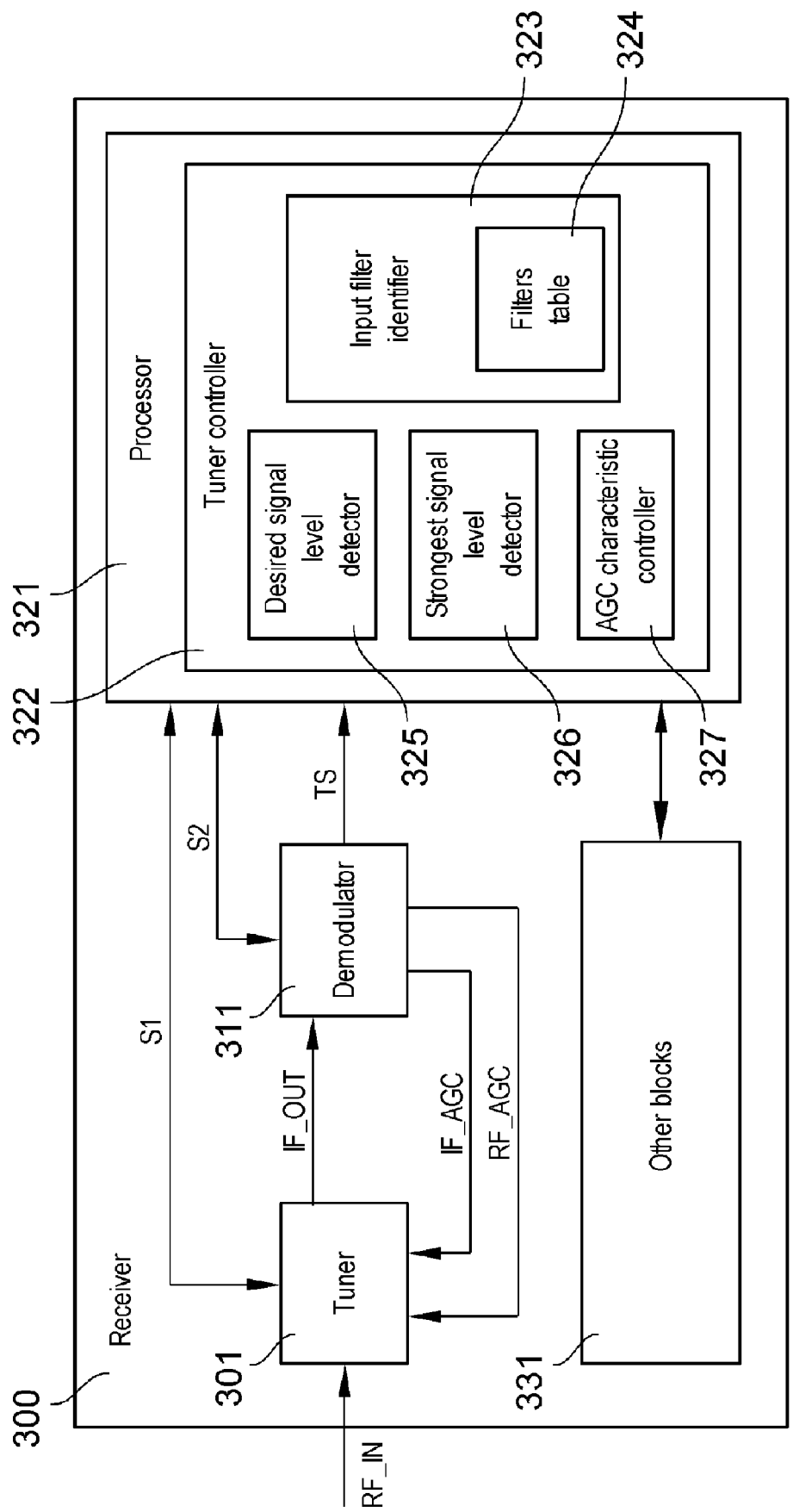
FIG. 3 shows a block schematic of the receiver.

FIG. 3 presents a signal receiver 300 according to the invention, for example a receiver of digital terrestrial television signals. A tuner 301 receives an RF_IN signal and outputs to a demodulator 311 a desired IF_OUT intermediate frequency signal. The demodulator, on the basis of the known level of the signal at the IF_OUT output of the amplifier IF_Amp 109 and the AGC characteristic set by the processor, controls gain of tuner amplifiers by RF_AGC and IF_AGC signals. The demodulator 311 sends to the processor 321 a digital stream of a desired signal TS. The processor is connected to the tuner 301 and the demodulator 311 with control signal lines S1 and S2, through which it transmits various commands (e.g. setting a specific AGC characteristic or tuning to a specific frequency). The processor 321 is also connected to other blocks 331 of the receiver 300.

The software of the processor 321 comprises a tuner controller 322, which performs the procedures explained in the next figures. The tuner controller 322 comprises an input filter identifier 323, which identifies the passband (its lower and upper limit) of the input filter for the reception of the desired signal. If the input filter of the tuner consists of a set of wideband filters, the input filter identifier 323 uses a filters table 324, from which it reads the parameters of the filter, which will be active for a signal of a given frequency. The desired signal level detector 325 is used for initial tuning to a desired signal and reading its level in step 402 of the procedure shown in FIG. 4. The strongest signal level detector 326 operates according to the procedure shown in FIG. 5, i.e. it tunes to signals of successive frequencies within the analyzed band, detects the signal level in successive IF bands and stores the strongest signal level. The AGC characteristic controller 327 calculates the parameters of the AGC characteristic according to the procedure shown in FIG. 8.

Figure 4:
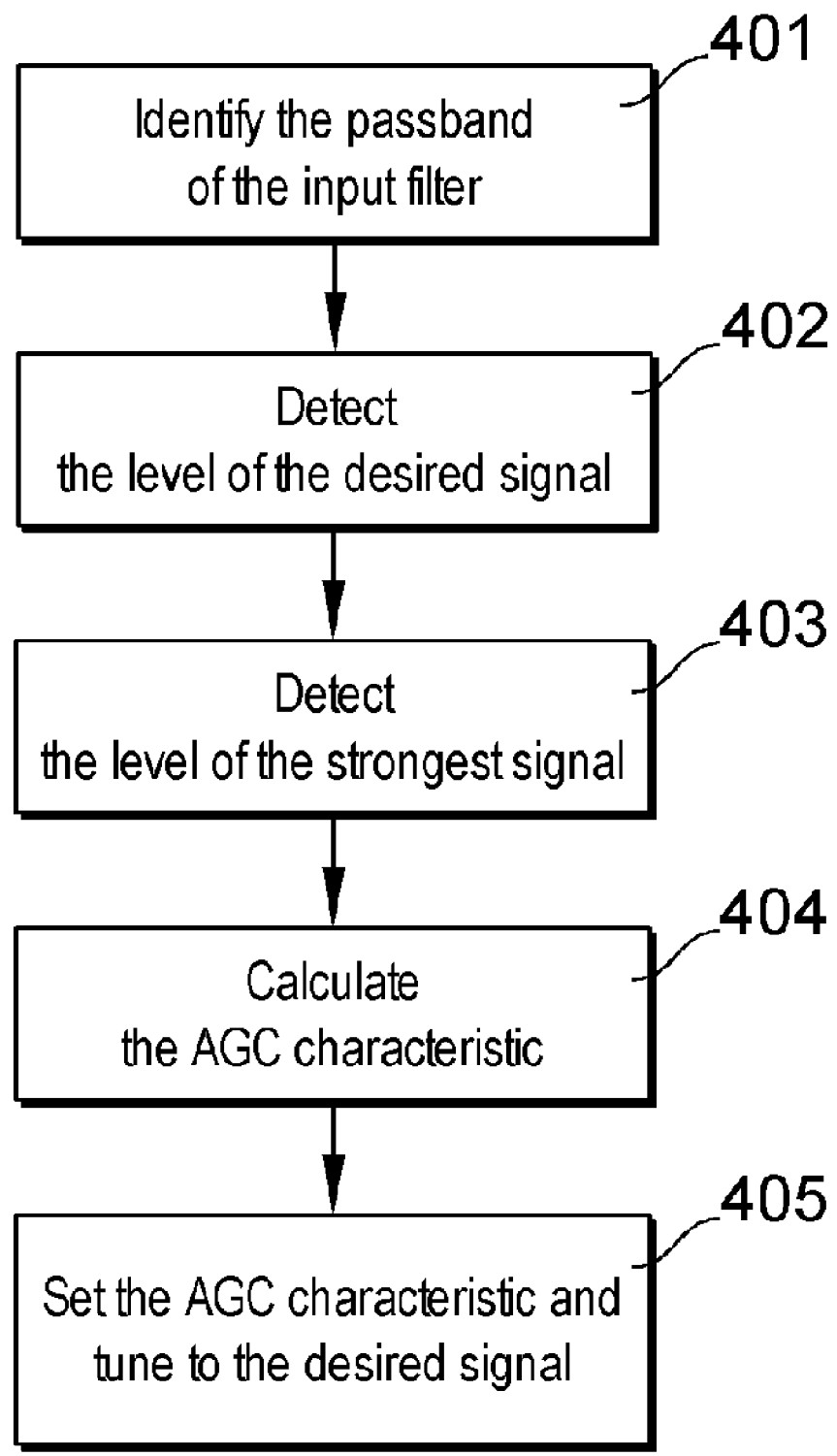
FIG. 4 shows a procedure for tuning the tuner to a desired frequency.

FIG. 4 shows a procedure for tuning the tuner to a desired frequency. In the first step, 401, the passband (its lower and upper limits) of the input filter is identified for reception of the desired signal. If the input filter consists of a set of wideband filters, then in this step the active filter is identified. Next, in step 402, the level of the desired signal is detected by initial tuning to the desired signal and calculating its level using the algorithm shown in FIG. 5. Next, in step 403, the level of the strongest signal in a given band is detected, using the procedure shown in FIG. 5. In step 404, on the basis of the strongest signal level compared to the desired signal level, the AGC characteristic is calculated, using the procedure shown in FIG. 8. In step 405 the calculated AGC characteristic is sent to the demodulator and the tuner is tuned to the desired signal. The AGC characteristic adjusted to the strongest signal in the whole passband of the input filter guarantees that the tuner will not be overloaded by strong signals, and if there are no strong signals, the increased sensitivity will allow receiving weak signals.

The essence of the procedure for reading the strongest signal level in a given band is that the tuner is tuned to successive signals within the band and for each tuned signal the level of the signal is detected (using the RF_AGC and IF_AGC signal levels set by the demodulator) and the strongest signal level is stored. The step between successive tuned signal frequencies can be equal to the width of the passband of the SAW2 filter. Preferably, the step can be set so that the detection procedure is performed exactly within the width of the passband of the input filter. Then, the value of the step is equal to the quotient of the difference of the width of the passband of the input filter (Input_filter_passband) and the width of the passband of the SAW2 filter (SAW2_passband) and the minimum number of steps (required to analyze the whole width of the passband of the input filter), which is a rounded up quotient of the width of the passband of the input filter and the width of the passband of the SAW2 filter decreased by one.

$$\text{STEP} = \frac{\text{Input\_filter\_passband} - \text{SAW2\_passband}}{\text{ROUNDUP}\left(\frac{\text{Input\_filter\_passband}}{\text{SAW2\_passband}} - 1\right)}$$

Figure 5:
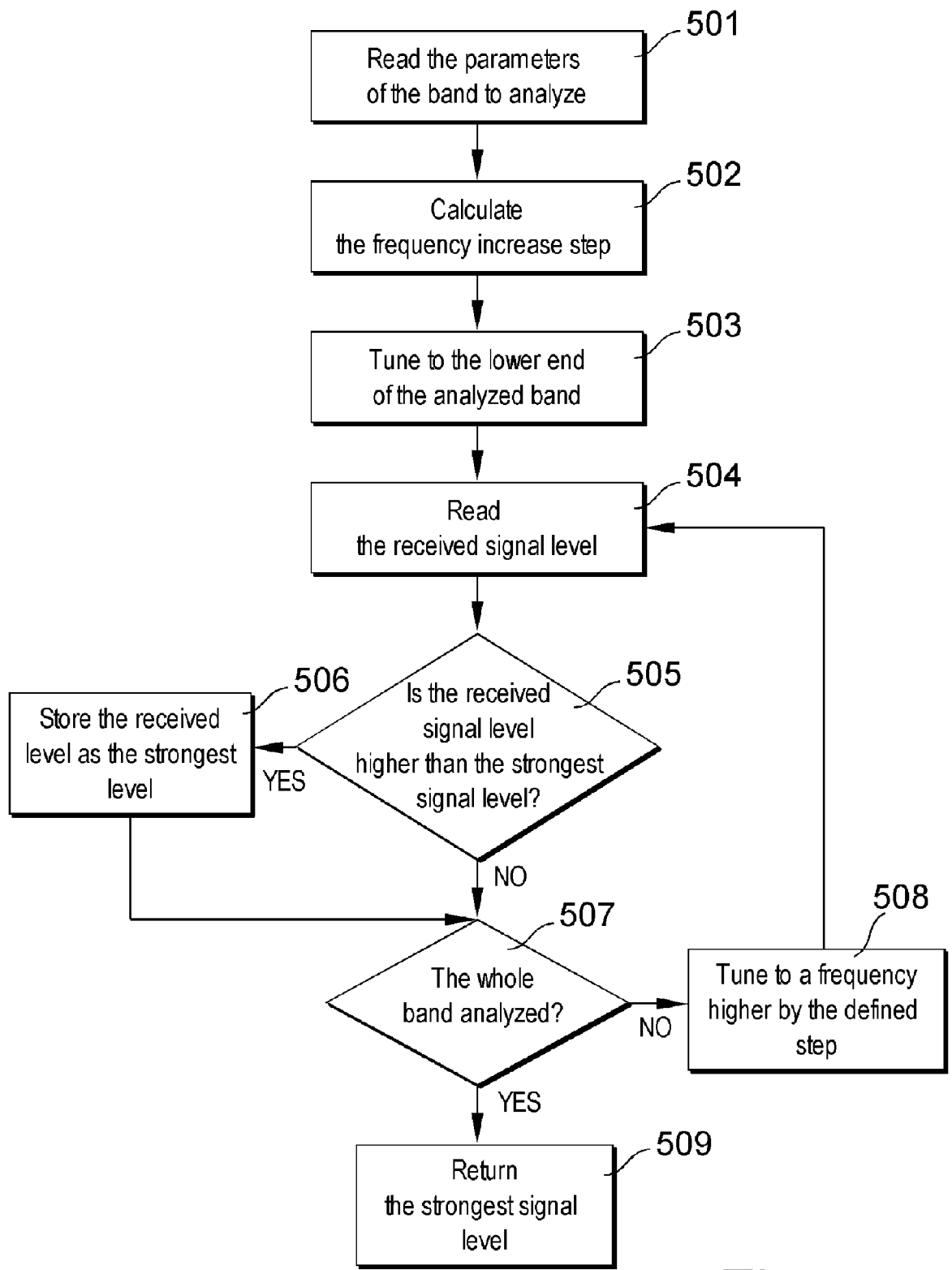
FIG. 5 shows a procedure for detecting the strongest signal level in a given band.

FIG. 5 shows an example of a detailed procedure for detecting the strongest signal level in a given band. In the first step 501, the parameters of the band for examination are read, especially its lower and upper frequency limit. Next, in step 502 a frequency increase step is calculated. In step 503 the tuner is tuned to a frequency equal to the lower frequency limit of the analyzed band (or, preferably, to a frequency higher than the lower limit by a half of the width of the passband of the SAW2 filter, in order to analyze exactly the whole passband of the input filter). After the tuner is locked to the given frequency, in step 504 there are read the levels of gains RF_AGC and IF_AGC set by the demodulator for the currently received signal. The level of the input signal is calculated using the fact that the level of the IF_OUT signal $P_{IF}$ is equal to the level of the input signal $P_{RF}$ increased by the RF stage gain $K_{RF}$ (controlled by the RF_AGC signal) and the IF stage gain $K_{IF}$ (controlled by the IF_AGC signal):

$$P_{RF} = P_{IF} - K_{RF} - K_{IF}$$

Next, in step 505 it is checked if the level of the currently received signal is higher than the strongest signal level received so far (which is initially equal to 0). If yes, in step 506 the level of the currently received signal is stored as the strongest signal level. Next, in step 507 it is checked if the whole band has been analyzed. If not, in step 508 the tuner is tuned to a frequency higher by the calculated frequency increase step. After the whole band has been analyzed, in step 509 the strongest signal level is returned.

Figure 6:
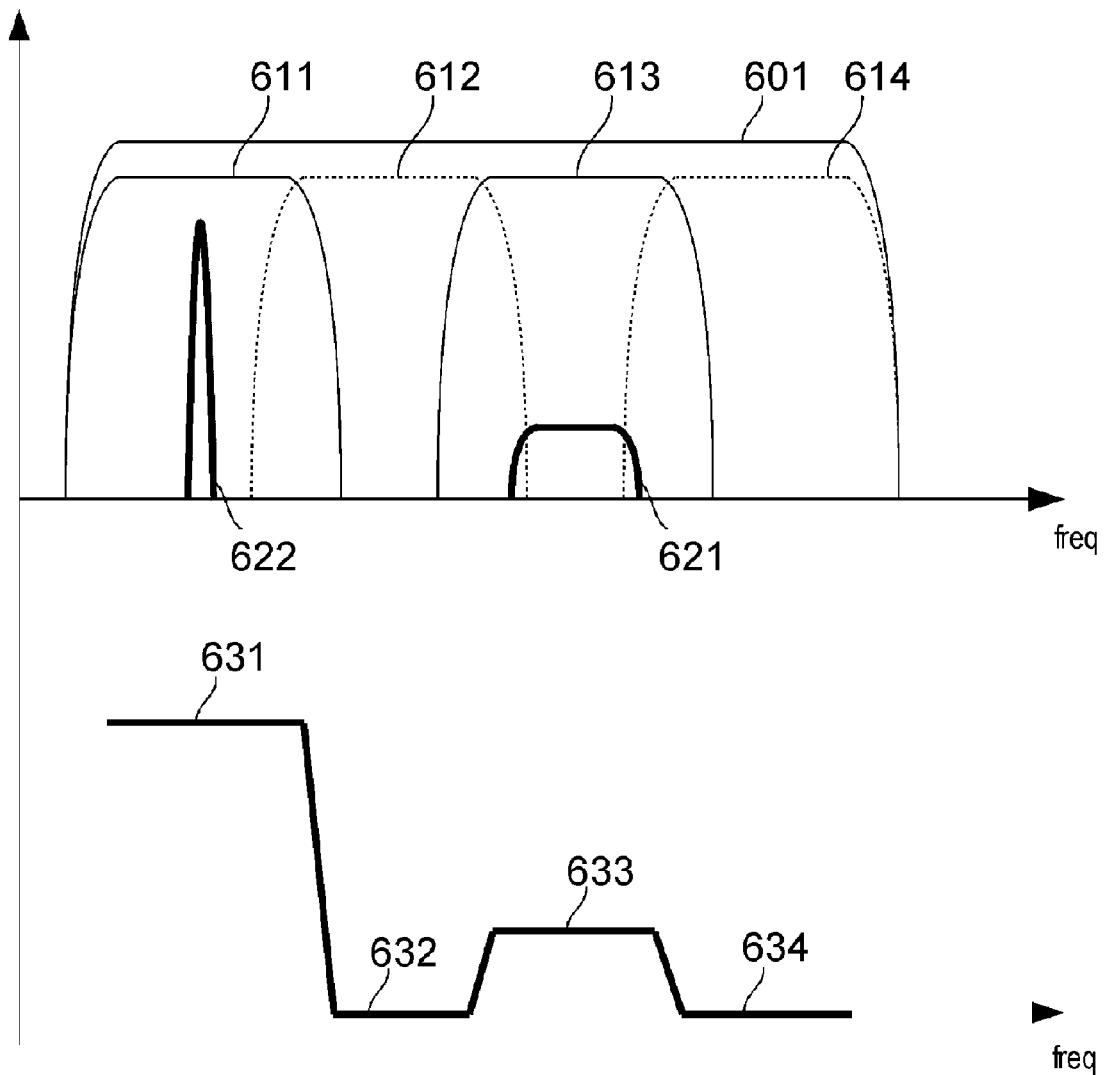
FIG. 6 shows the exemplary process of detecting the strongest signal level according to the procedure shown in FIG. 5.

FIG. 6 presents an exemplary process of detecting the strongest signal level according to the procedure shown in FIG. 5. The upper chart shows a fragment of the band 601 within the passband of the input filter. Numbers 611, 612, 613, 614 designate the fragments of the band within the passband of the SAW2 filter for the tuner tuned to successive frequencies. For easier recognition of the adjacent characteristics, they are marked alternatively by continuous and dotted lines. The lower chart presents the level of the signal detected in successive procedure loops—in the first loop a strong undesired signal 622 of level 631 was found in band 611, in the third loop a weak desired signal 621 of level 633 was found in band 613, and in the second and fourth loops the signal level in bands 612 and 614 was zero, respectively 632 and 634.

Figure 7:
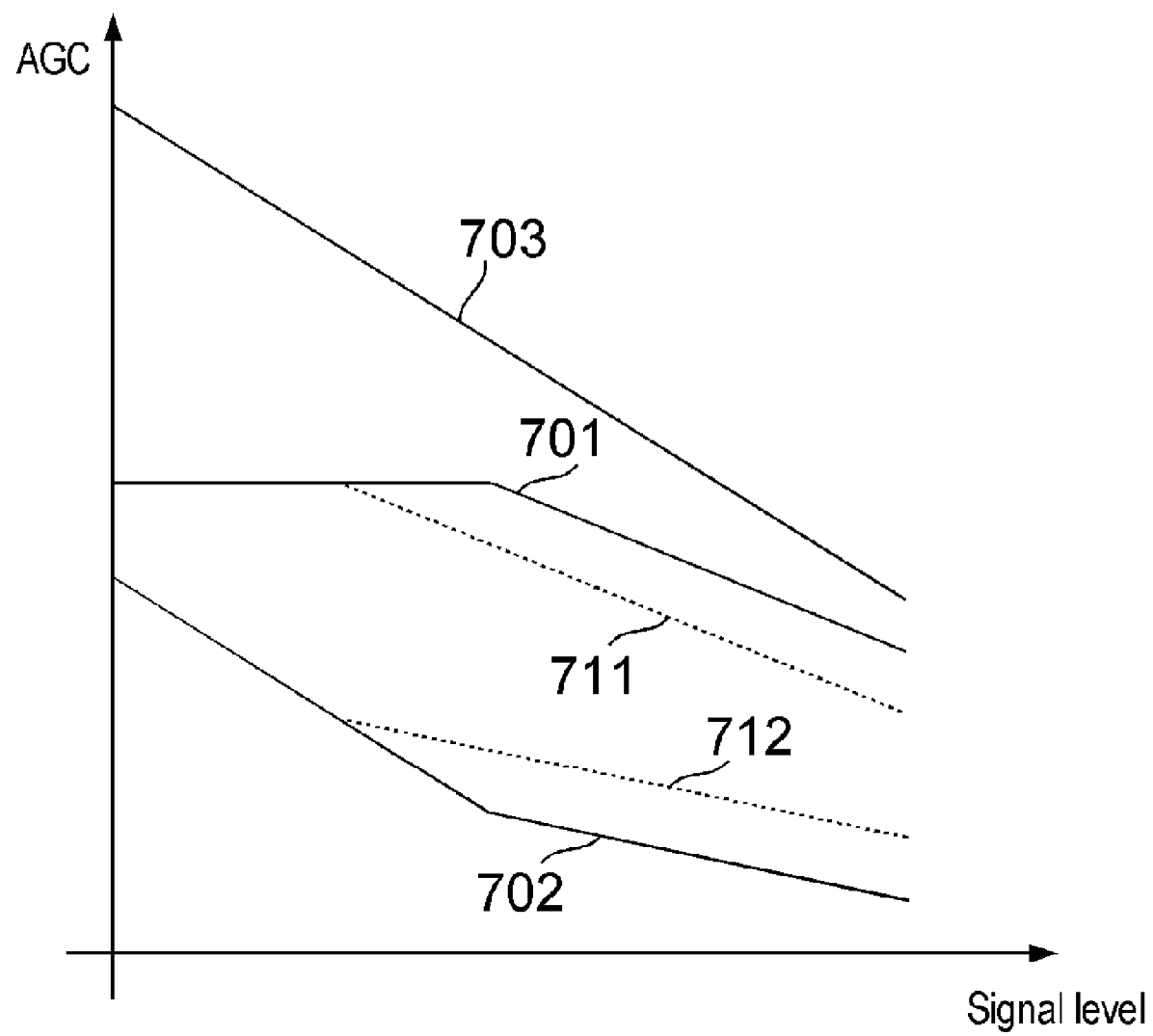
FIG. 7 shows the AGC characteristic of the tuner.
Figure 8:
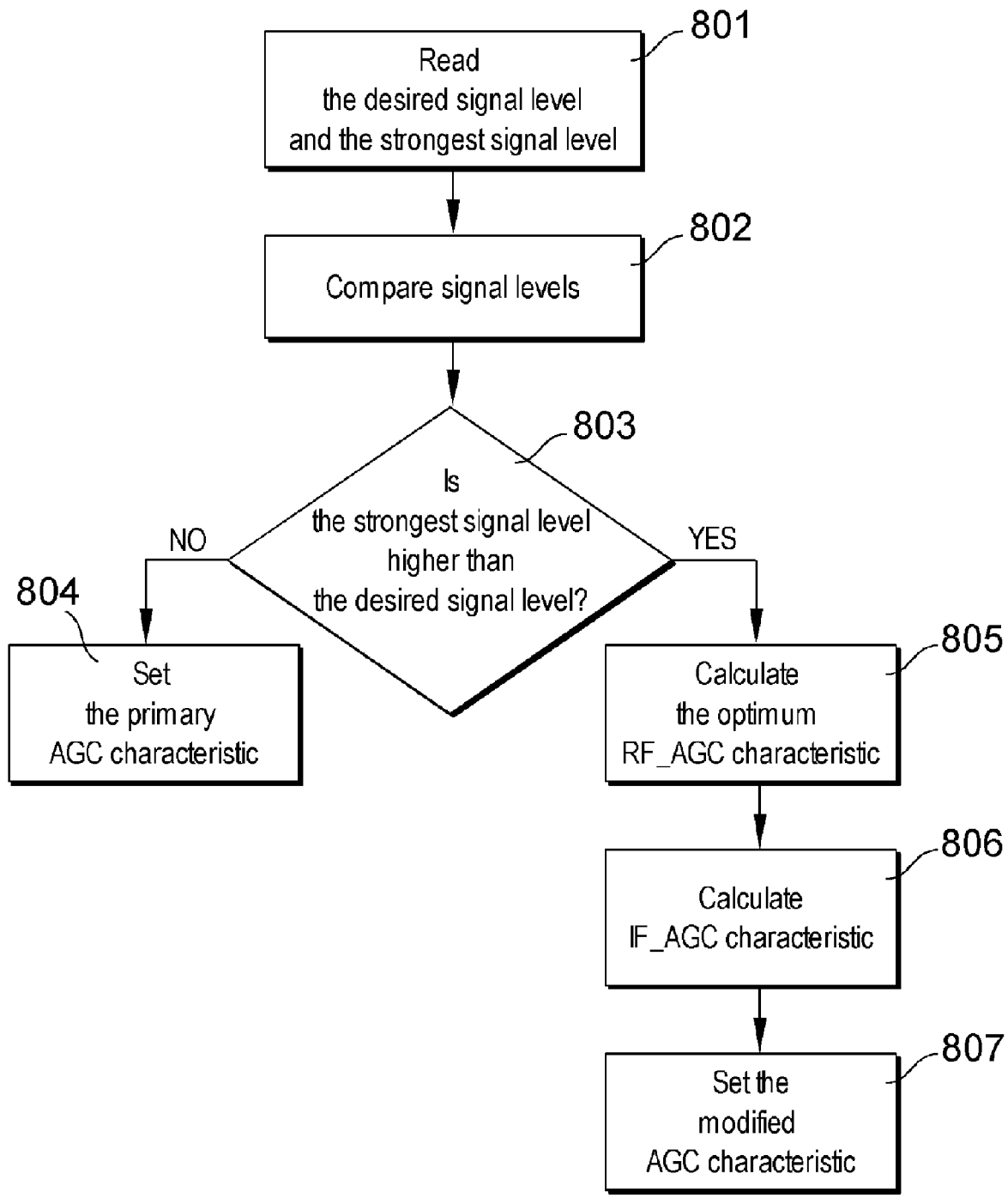
FIG. 8 shows a procedure for calculating the AGC characteristic of the tuner.

FIG. 7 shows the AGC characteristic of the tuner, which is calculated according to the procedure shown in FIG. 8. The tuner has a primary AGC characteristic defined at the design or production stage, which defines the values of RF_AGC 701 and IF_AGC 702 gains (resulting in a total gain 703) for certain signal levels. If there are no signals stronger than the desired signal in the passband of the input filter, the demodulator should adjust the RF_AGC and IF_AGC gains according to the primary characteristic. If a stronger signal exists, the first stage gain, RF_AGC 711, should be lowered such that the undesired signals do not cause the overload of the input stages of the tuner, and the reception of a weak signal is possible. After the RF_AGC 711 characteristic is changed, the IF_AGC 712 characteristic is adjusted so that the total gain 703 is equal to the total gain of the primary characteristic.

In the first step 801 of the procedure shown in FIG. 8, the desired signal level and the strongest signal level are read. Next, in step 802 the levels are compared, and in step 803 it is checked if the strongest signal level is higher than the desired signal level. If the strongest signal level is lower or equal to the desired signal level, then the primary AGC characteristic is set in step 804. If the strongest signal level is higher than the desired signal level, then an optimal RF_AGC characteristic is calculated in step 805. Next, 806, the IF_AGC characteristic is calculated so that the total gain is equal to the total gain of the primary characteristic. Next, in step 807, the calculated AGC characteristic is set.

The present invention allows detecting the level of signals within the passband of the input filter for reception of the desired signal, which allows calculating the optimum AGC characteristic of the tuner, and especially the maximum allowed RF_AGC gain. For strong signals present, it allows avoiding tuner overload, but in absence of strong signals, it allows increasing RF_AGC gain and reception of weak signals.

The preferred embodiment having been thus described, it will now be evident to those skilled in the art that further variation thereto may be contemplated. Such variations are not regarded as a departure from the invention, the true scope of the invention being set forth in the claims appended hereto.

What is claimed is:

1. A method for optimizing gain of a tuner for reception of a desired signal and equipped with a band-pass high frequency input filter, a band-pass intermediate frequency filter having a passband width narrower than the passband width of the input filter and amplifiers having gain automatically controlled according to an AGC characteristic of the tuner to provide a constant level of a tuner output signal IF_OUT, the method comprising the following steps:
    determining a level of the desired signal;
    identifying a passband of the input filter for the desired signal;
    tuning the tuner to successive frequencies within the passband of the input filter;
    calculating a level of signals for each tuned frequency on the basis of the gain of the amplifiers corresponding to each tuned frequency;
    selecting the strongest level of close signals; and
    calculating the AGC characteristic of the tuner on the basis of the level of the desired signal and the strongest level of close signals.

2. The method according to claim 1, further comprising the following steps:
    equipping the input filter with a set of wideband filters;
    determining an activated wideband filter belonging to the set of wideband filters for the desired signal in order to identify the passband of the input filter;
    reading parameters the activated wideband filter; and
    tuning to successive frequencies starting with the lower end of the activated wideband filter.

3. The method according to claim 1, wherein the strongest level of all read signals is stored while tuning the tuner to successive frequencies within the identified passband of the input filter.

4. The method according to claim 1, wherein the tuner is tuned to successive frequencies in steps equal to the width of the passband of the intermediate frequency filter.

5. The method according to claim 1, wherein the tuner is tuned to successive frequencies in steps equal to the quotient of the difference between the width of the passband of the input filter and the width of the passband of the intermediate frequency filter, and the minimum number of steps required to analyze the whole passband of the input filter.

6. The method according to claim 1, wherein the AGC characteristic of the tuner is calculated on the basis of the primary characteristic, for which, if the strongest level of close signals is higher than the level of the desired signal, the optimal RF_AGC characteristic is calculated such that the close signals do not cause the overload of the input stages of the tuner and the reception of a weak desired signal is possible, and next the IF_AGC characteristic is adjusted to the RF_AGC characteristic.

7. A signal receiver comprising
a tuner (301) having
a band-pass high frequency input filter (101);
a band-pass intermediate frequency filter (104) having a passband width narrower than the passband width of the input filter (101);
amplifiers (102), (109) with gain automatically controlled by a demodulator (311) according to an AGC characteristic of the tuner to provide a constant level of a tuner output signal IF_OUT; and
a processor (321) equipped with a tuner controller (322), the tuner controller (322) having
an AGC characteristic controller (327) for calculating the AGC characteristic of the tuner on the basis of a level of the desired signal and a strongest level of close signals,
an input filter identifier (323) identifying a passband of the input filter (101) for the desired signal,
a desired signal level detector (325) calculating the desired signal level on the basis of the gain of the amplifiers (102), (109) for the desired signal, and
a strongest signal level detector (326) determining the strongest level of close signals by tuning the tuner (100) to successive frequencies within the identified passband of the input filter (101) for the desired signal and calculating the level of signals for each tuned frequency on the basis of the gain of the amplifiers (102), (109) for each tuned frequency.

8. The signal receiver according to claim 7, wherein the input filter (101) consists of a set of wideband filters, and the input filter identifier (323) is provided with a filters table (324), which allows identifying the wideband filter which is activated for the desired signal.

9. The signal receiver according to claim 7, wherein the strongest signal level detector (326), while tuning the tuner (100) to successive frequencies within the identified passband of the input filter (101), stores only the strongest level of signals read so far.

10. The signal receiver according to claim 7, wherein the AGC characteristic controller (327) comprises a primary characteristic definition, for which, if the strongest level of close signals is higher than the level of the desired signal, the optimal RF_AGC characteristic is calculated such that the close signals do not cause the overload of the input stages of the tuner and the reception of a weak desired signal is possible, and next the IF_AGC characteristic is adjusted to the RF_AGC characteristic.

* * * * *